(12) United States Patent
Zha et al.

(10) Patent No.: US 12,113,586 B2
(45) Date of Patent: Oct. 8, 2024

(54) METHOD AND APPARATUS FOR DETERMINING PASSIVE INTERMODULATION SIGNAL STRENGTH IN A COMMUNICATION NETWORK

(71) Applicant: Huawei Technologies Co., Ltd., Shenzhen (CN)

(72) Inventors: Jingfang Zha, Shanghai (CN);
Chunyuan Chen, Shanghai (CN);
Qingjiang Wang, Shanghai (CN);
Chun Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 350 days.

(21) Appl. No.: 17/732,051

(22) Filed: Apr. 28, 2022

(65) Prior Publication Data
US 2022/0255645 A1     Aug. 11, 2022

Related U.S. Application Data

(63) Continuation of application No. PCT/CN2020/125401, filed on Oct. 30, 2020.

(30) Foreign Application Priority Data

Oct. 31, 2019  (CN) .......................... 201911058838.5

(51) Int. Cl.
*H04B 17/318*  (2015.01)
*H04B 17/15*   (2015.01)
*H04W 72/542*  (2023.01)

(52) U.S. Cl.
CPC .......... *H04B 17/318* (2015.01); *H04B 17/15* (2015.01); *H04W 72/542* (2023.01)

(58) Field of Classification Search
CPC .... H04B 17/318; H04B 17/15; H04B 1/1027; H04B 17/104; H04B 17/3912;
(Continued)

(56) References Cited

U.S. PATENT DOCUMENTS

2012/0295558 A1  11/2012  Wang et al.
2014/0036969 A1   2/2014  Wyville et al.
(Continued)

FOREIGN PATENT DOCUMENTS

CN         1870473 A     11/2006
CN       103858355 A      6/2014
(Continued)

OTHER PUBLICATIONS

Dou Jian-hua et al., "Design of PIM testing system of power divider in GSM frequency range," Journal of Hefei University of Technology, (Natural Science), vol. 33, No. 8, total 4 pages (Aug. 2010). With English abstract.

(Continued)

*Primary Examiner* — Ian N Moore
*Assistant Examiner* — Sun Jong Kim
(74) *Attorney, Agent, or Firm* — Leydig, Voit & Mayer, Ltd.

(57) ABSTRACT

Embodiments of this application disclose a signal processing method and a related apparatus, to estimate a passive intermodulation (PIM) signal strength. The method in embodiments of this application includes: obtaining first downlink signal data corresponding to each of N cells in a preset bandwidth resource scheduling solution. Then, first characteristic data corresponding to each piece of the first downlink signal data is determined. Then, a first passive intermodulation PIM signal strength corresponding to a first cell is determined based on a preset signal strength evaluation model and the first characteristic data corresponding to each (Continued)

of the N cells, to accurately estimate impact of the first PIM signal on the first cell.

12 Claims, 8 Drawing Sheets

(58) Field of Classification Search
CPC .. H04B 17/391; H04W 72/542; H04W 24/00; G01R 23/20
See application file for complete search history.

(56) References Cited

U.S. PATENT DOCUMENTS

| | | |
|---|---|---|
| 2014/0378067 A1 | 12/2014 | Au |
| 2015/0318882 A1* | 11/2015 | Wyville ............... H04J 11/0023 370/252 |
| 2015/0358144 A1 | 12/2015 | Fleischer et al. |
| 2016/0301436 A1 | 10/2016 | Zou et al. |
| 2019/0052294 A1 | 2/2019 | Abdelmonem |
| 2020/0021323 A1* | 1/2020 | Cyzs ..................... H04B 1/123 |
| 2020/0145852 A1* | 5/2020 | Ayala ..................... H04W 24/08 |
| 2021/0160746 A1* | 5/2021 | Diggins ............ H04W 36/0083 |

FOREIGN PATENT DOCUMENTS

| | | |
|---|---|---|
| CN | 104471881 A | 3/2015 |
| CN | 105049067 A | 11/2015 |
| CN | 107666361 A | 2/2018 |
| CN | 109845118 A | 6/2019 |
| WO | 2017006155 A1 | 1/2017 |
| WO | 2017157461 A1 | 9/2017 |
| WO | 2019203704 A1 | 10/2019 |

OTHER PUBLICATIONS

TeliaSonera AB, "TP for TR 37.808: LTE single-band higher-order PIM measurement results," 3GPP TSG-RAN WG4 Meeting #66bis, Chicago, USA, R4-131990, total 9 pages, 3rd Generation Partnership Project, Valbonne, France (Apr. 15-19, 2013).

* cited by examiner

METHOD AND APPARATUS FOR DETERMINING PASSIVE INTERMODULATION SIGNAL STRENGTH IN A COMMUNICATION NETWORK

CROSS-REFERENCE TO RELATED APPLICATIONS

This application is a continuation of International Application No. PCT/CN2020/125401, filed on Oct. 30, 2020, which claims priority to Chinese Patent Application No. 201911058838.5, filed on Oct. 31, 2019. The disclosures of the aforementioned applications are incorporated herein by reference in these entireties.

TECHNICAL FIELD

Embodiments of this application relate to the field of communication technologies, and in particular, to a signal processing method and a related apparatus.

BACKGROUND

As operators' spectrum and antenna installation platform resources are increasingly in shortage, radio frequency modules and antenna feeder ports both evolve toward wideband and multi-band. As a result, the impact of passive intermodulation (PIM) becomes more prominent.

In order to cope with the impact of the PIM, the impact of the PIM is estimated. A current estimation method is that, for each carrier, transmit sub-bands are sequentially selected from a transmit frequency band, and for a PIM signal generated by each transmit sub-band, a frequency band that does not overlap with the PIM signal is determined in a receive frequency band.

This method can determine only the frequency band that does not overlap with the PIM signal in the receive frequency band, but when the PIM signal overlaps with the receive frequency band, the impact of the PIM signal cannot be well estimated.

SUMMARY

Embodiments of this application provide a signal processing method and a related apparatus, to estimate PIM signal strength, and to accurately estimate the impact of a PIM signal.

A first aspect of embodiments of this application provides a signal processing method.

First, scheduling may be performed according to a preset bandwidth resource scheduling solution, and at the same time, first downlink signal data corresponding to each of N cells in the preset bandwidth resource scheduling solution is obtained, where N is a positive integer greater than 1.

Then, first characteristic data corresponding to each piece of the first downlink signal data is determined, where the first characteristic data corresponds to a signal strength evaluation model.

Finally, first passive intermodulation PIM signal strength corresponding to a first cell is determined based on a preset signal strength evaluation model and characteristic data corresponding to each of the N cells, where the signal strength evaluation model is used to output first PIM signal strength based on input first characteristic data, and the first cell is any one of the N cells.

The PIM signal strength of any one of the N cells can be determined by using the foregoing method, so that an impact of the PIM signal on each cell can be estimated accurately.

Based on the first aspect, this embodiment of this application further provides a first implementation of the first aspect:

Before that first passive intermodulation PIM signal strength corresponding to a first cell is determined based on a preset signal strength evaluation model and the first characteristic data corresponding to each of the N cells, second downlink signal data corresponding to each of the N cells within the preset time period is obtained.

Because none of the N cells has uplink data within the preset time period, second uplink signal strength corresponding to the first cell within the preset time period can be obtained, and the second uplink signal strength is used as second PIM signal strength.

Then, training characteristic data is determined based on the second downlink signal data corresponding to the N cells within the preset time period, where there may be a plurality of types of the training characteristic data, and the training characteristic data may be set based on a requirement.

Finally, training is performed based on the training characteristic data, the second PIM signal strength within the preset time period, and a preset model training function, to obtain a signal strength evaluation model.

Based on the foregoing operations, the signal strength evaluation model used to determine the PIM signal strength can be obtained, so that the impact of the PIM signal can be estimated accurately.

Based on the first implementation of the first aspect, this embodiment of this application further provides a second implementation of the first aspect:

Because the second downlink signal data is not aligned with the second PIM signal strength in terms of time, before the training characteristic data is determined based on the second downlink signal data corresponding to the N cells within the preset time period, the second downlink signal data corresponding to each of the N cells within the preset time period is aligned with the second PIM signal strength corresponding to the first cell in terms of time.

The second downlink signal data is aligned with the second PIM signal strength in terms of time, and this can ensure that the signal strength evaluation model obtained by training is accurate enough, so as to ensure that the PIM signal strength determined by using the signal strength evaluation model is of high reference.

Based on the second implementation of the first aspect, this embodiment of this application further provides a third implementation of the first aspect:

That the second downlink signal data corresponding to each of the N cells within the preset time period is aligned with the second PIM signal strength corresponding to the first cell in terms of time includes:

for each cell in the N cells, calculating a most relevant value based on a preset calculation function, the second downlink signal data within the preset time period, and the second PIM signal strength corresponding to the first cell within the preset time period; and based on the most relevant value, aligning the second downlink signal data within the preset time period with the second PIM signal strength corresponding to the first cell within the preset time period in terms of time.

There are a plurality of manners of aligning the second downlink signal data with the second PIM signal strength in terms of time. This embodiment of this application provides a solution for aligning the second downlink signal data with the second PIM signal strength based on the most relevant value.

Based on the first implementation of the first aspect, this embodiment of this application further provides a fourth implementation of the first aspect:

That training characteristic data is determined based on the second downlink signal data corresponding to the N cells within the preset time period includes:
  generating M intermodulation bases based on the second downlink signal data corresponding to the N cells within the preset time period, where M is a positive integer; and
  determining the M intermodulation bases and the second downlink signal data corresponding to the N cells as the training characteristic data.

There are a plurality of methods for selecting the training characteristic data. In this embodiment of this application, the M intermodulation bases and the second downlink signal data are used as the training characteristic data for training, so that an accurate signal strength evaluation model can be obtained.

Based on the first aspect, or the first implementation of the first aspect, or the second implementation of the first aspect, or the third implementation of the first aspect, or the fourth implementation of the first aspect, this embodiment of this application further provides a fifth implementation of the first aspect:
  scheduling a bandwidth resource of the first cell based on the first PIM signal strength of the first cell in a plurality of bandwidth resource scheduling solutions.

By determining the first PIM signal strength, a degree to which a bandwidth resource is affected by a PIM signal in each bandwidth resource scheduling solution can be accurately known. Therefore, bandwidth resource scheduling is performed based on the first PIM signal strength, so that utilization of the bandwidth resource can be improved.

Based on the first aspect, or the first implementation of the first aspect, or the second implementation of the first aspect, or the third implementation of the first aspect, or the fourth implementation of the first aspect, the embodiment of this application further provides a sixth implementation of the first aspect:
  determining a quality of an antenna feeder system based on the first PIM signal strength of the first cell.

In this embodiment of this application, the first PIM signal strength is used as an indicator to reflect the quality of the antenna feeder system.

A second aspect of embodiments of this application provides a signal processing apparatus, including:
  a first obtaining unit, configured to obtain first downlink signal data corresponding to each of N cells in a preset bandwidth resource scheduling solution, wherein N is a positive integer greater than 1;
  a first determining unit, configured to determine first characteristic data corresponding to each piece of the first downlink signal data; and
  a second determining unit, configured to determine, based on a preset signal strength evaluation model and the first characteristic data corresponding to each of the N cells, first passive intermodulation PIM signal strength corresponding to a first cell, where the signal strength evaluation model is used to output first PIM signal strength based on input first characteristic data, and the first cell is any one of the N cells.

Based on the second aspect, this embodiment of this application further provides a first implementation of the second aspect, and the signal processing apparatus further includes:
  a second obtaining unit, configured to obtain second downlink signal data corresponding to each of the N cells within a preset time period, where none of the N cells has uplink data within the preset time period, where
  the second obtaining unit is further configured to obtain second uplink signal strength corresponding to the first cell within the preset time period, and use the second uplink signal strength as second PIM signal strength;
  a third determining unit, configured to determine training characteristic data based on the second downlink signal data corresponding to the N cells within the preset time period; and
  a training unit, configured to perform training based on the training characteristic data, the second PIM signal strength within the preset time period, and a preset model training function, to obtain the signal strength evaluation model.

Based on the first implementation of the second aspect, this embodiment of this application further provides a second implementation of the second aspect, and the signal processing apparatus further includes:
  an aligning unit, configured to align the second downlink signal data corresponding to each of the N cells within the preset time period with the second PIM signal strength corresponding to the first cell in terms of time.

Based on the second implementation of the second aspect, this embodiment of this application further provides a third implementation of the second aspect, and the aligning unit is configured to:
  for each cell in the N cells, calculate a most relevant value based on a preset calculation function, the second downlink signal data within the preset time period, and the second PIM signal strength corresponding to the first cell within the preset time period; and
  align, based on the most relevant value, the second downlink signal data within the preset time period with the second PIM signal strength corresponding to the first cell within the preset time period in terms of time.

Based on the first implementation of the second aspect, this embodiment of this application further provides a second implementation of the second aspect, and the third determining unit is configured to:
  generate M intermodulation bases based on the second downlink signal data corresponding to the N cells within the preset time period, where M is a positive integer; and
  determine the M intermodulation bases and the second downlink signal data corresponding to the N cells as the training characteristic data.

Based on the second aspect, or the first implementation of the second aspect, or the second implementation of the second aspect, or the third implementation of the second aspect, or the fourth implementation of the second aspect, this embodiment of this application further provides a fifth implementation of the second aspect, and the signal processing apparatus further includes:
  a scheduling unit, configured to schedule a bandwidth resource of the first cell based on the first PIM signal strength of the first cell in a plurality of bandwidth resource scheduling solutions.

Based on the second aspect, or the first implementation of the second aspect, or the second implementation of the second aspect, or the third implementation of the second aspect, or the fourth implementation of the second aspect, this embodiment of this application further provides a sixth implementation of the second aspect, and the signal processing apparatus further includes:

a fourth determining unit, configured to determine a quality of an antenna feeder system based on the first PIM signal strength of the first cell.

A third aspect of the embodiment of this application provides a communication apparatus, including at least one processor and a power supplying circuit, where the power supplying circuit is configured to supply power to the processor, and related program instructions are executed in the at least one processor, so that the communication apparatus is enabled to implement the method according to any one of the first aspect or the implementations of the first aspect of this application.

A fourth aspect of the embodiment of this application provides a computer-readable storage medium, including instructions, and when the instructions are run on a computer, the computer is enabled to perform the procedure in the method according to any one of the first aspect or the implementations of the first aspect.

A fifth aspect of this embodiment of this application provides a computer program product, where the computer program product includes computer software instructions, and the computer software instructions may be loaded by using a processor to implement the procedure in the method according to any one of the first aspect or the implementations of the first aspect.

It can be learned from the foregoing technical solutions that embodiments of this application have the following advantages.

The first downlink signal data corresponding to each of the N cells in the preset bandwidth resource scheduling solution is first obtained, where N is a positive integer greater than 1. Then, the first characteristic data corresponding to each piece of first downlink signal data is determined. Finally, the first passive intermodulation PIM signal strength corresponding to the first cell is determined based on the preset signal strength evaluation model and the first characteristic data corresponding to each of the N cells, where the signal strength evaluation model is used to output the first PIM signal strength based on the input first characteristic data, and the first cell is any one of the N cells. In embodiments of this application, the first PIM signal strength of the first cell can be accurately estimated, so that the impact of the first PIM signal on the cell can be accurately determined.

DESCRIPTION OF EMBODIMENTS

Figure 1:
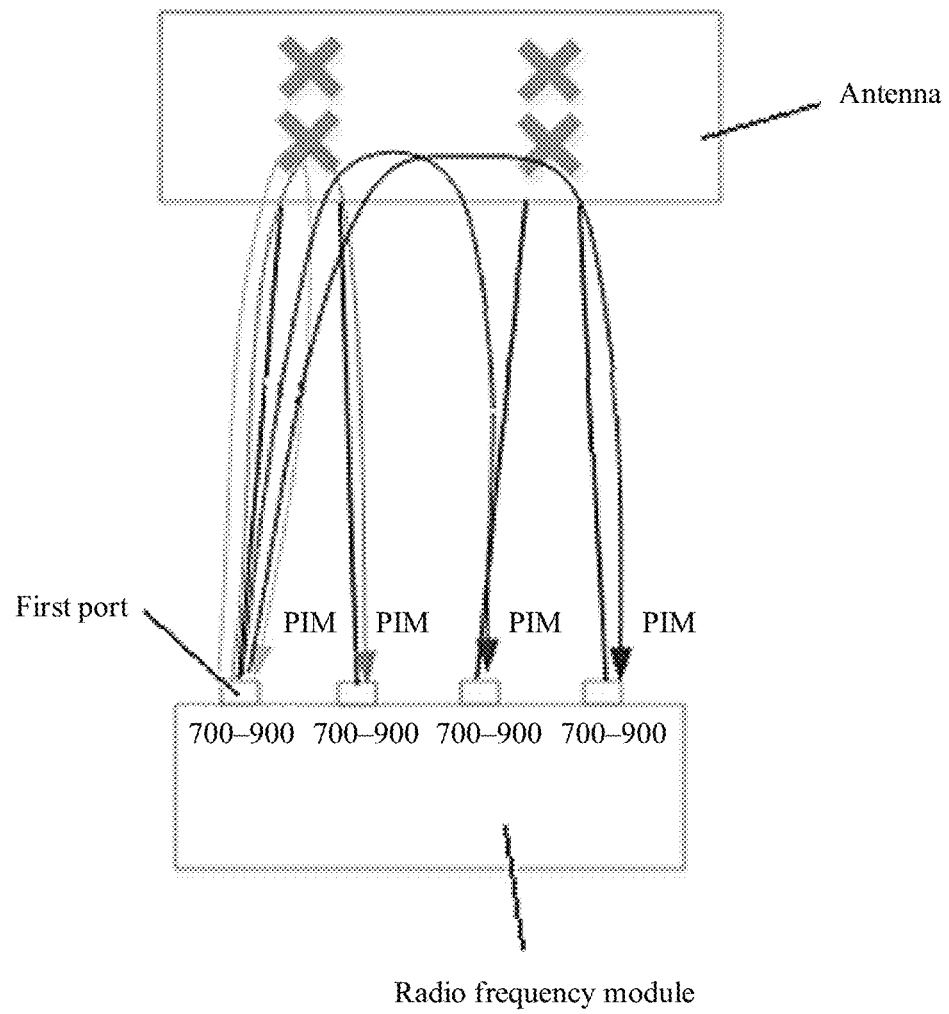
FIG. 1 is a schematic diagram of a networking architecture according to an embodiment of this application.

The following describes in detail the technical solutions in embodiments of this application with reference to the accompanying drawings in embodiments of this application. FIG. 1 is a schematic diagram of a networking architecture according to an embodiment of this application. The architecture includes a radio frequency module and an antenna, where four ports are disposed on the radio frequency module. Each port is connected to the antenna and can transmit a downlink signal and receive an uplink signal. As shown in FIG. 1, downlink signals whose frequencies are different and that are sent by a first port of the radio frequency module interact with each other in the antenna to generate passive intermodulation. A PIM signal is received by each port, and consequently causes interference to each port. A directed arrow in FIG. 1 indicates a generated PIM signal. To better estimate impact of the PIM signal, a signal processing method is provided in this embodiment of this application. In the method, PIM signal strength can be estimated, to determine specific impact of the PIM signal on an uplink signal on an overlapping frequency band, but not to determine only the overlapping frequency band of the PIM signal and the uplink signal.

It should be noted that the method in this embodiment of this application is not limited to the networking architecture shown in FIG. 1, and may be further applied to another system architecture in which the PIM signal exists. Because the radio frequency module shown in FIG. 1 includes a plurality of ports, interference of the PIM signal is more prominent. Therefore, in this embodiment of this application, FIG. 1 is used as an example to describe the signal processing method.

Figure 2A:
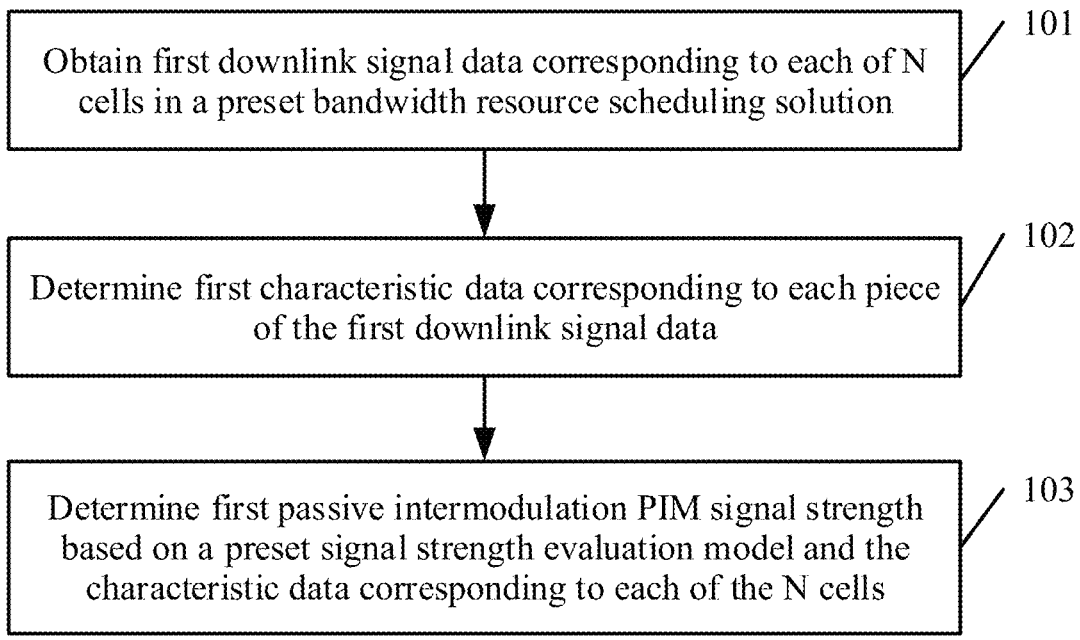
FIG. 2A is a schematic diagram of a first embodiment of a signal processing method according to an embodiment of the present invention.

For ease of understanding, FIG. 2A is a schematic diagram of a first embodiment of a signal processing method according to an embodiment of the present invention. As shown in FIG. 2A, this embodiment of this application provides the first embodiment of the signal processing method, including the following steps.

101: Obtain first downlink signal data corresponding to each of N cells in a preset bandwidth resource scheduling solution, where N is a positive integer greater than 1.

In this embodiment of this application, the bandwidth resource scheduling solution includes transmit bandwidths of downlink signals of the N cells and receive bandwidths of uplink signals of the N cells. A first downlink signal is transmitted to each of the N cells according to the bandwidth resource scheduling solution, and then the first downlink signal data is collected.

It should be noted that a location at which the first downlink signal data is collected is not limited in this embodiment of this application, and the location may be adjusted based on an actual requirement, provided that the location is consistent with a location at which the downlink signal data is collected when a signal strength evaluation model is trained.

In addition, the first downlink signal data may include a plurality of types of data, such as, first downlink signal strength.

102: Determine first characteristic data corresponding to each piece of the first downlink signal data.

It should be noted that the first characteristic data is also determined by the signal strength evaluation model. A type of the first characteristic data is consistent with that of characteristic data used when the signal strength evaluation model is trained. A process of determining the first characteristic data is corresponding to the type of the first characteristic data. This is not limited in this embodiment of this application.

103: Determine, based on a preset signal strength evaluation model and characteristic data corresponding to each of the N cells, first passive intermodulation PIM signal strength corresponding to a first cell, where the signal strength evaluation model is used to output first PIM signal strength based on the input first characteristic data, and the first cell is any one of the N cells.

It may be understood that first downlink signals of the N cells interact with each other to generate PIM signals that are in a one-to-one correspondence with the cells, and the signal strength evaluation model represents an association relationship between characteristic data and PIM signal strength. Therefore, the first PIM signal strength corresponding to the first cell can be obtained based on the signal strength evaluation model and the first characteristic data corresponding to the first downlink signal data.

In this embodiment of this application, the PIM signal strength corresponding to each cell can be estimated by using the signal strength evaluation model, so that impact of the PIM signal on each cell can be accurately determined, but it is not limited to determining only a status of frequency band overlapping between the PIM signal and an uplink signal.

Figure 2B:
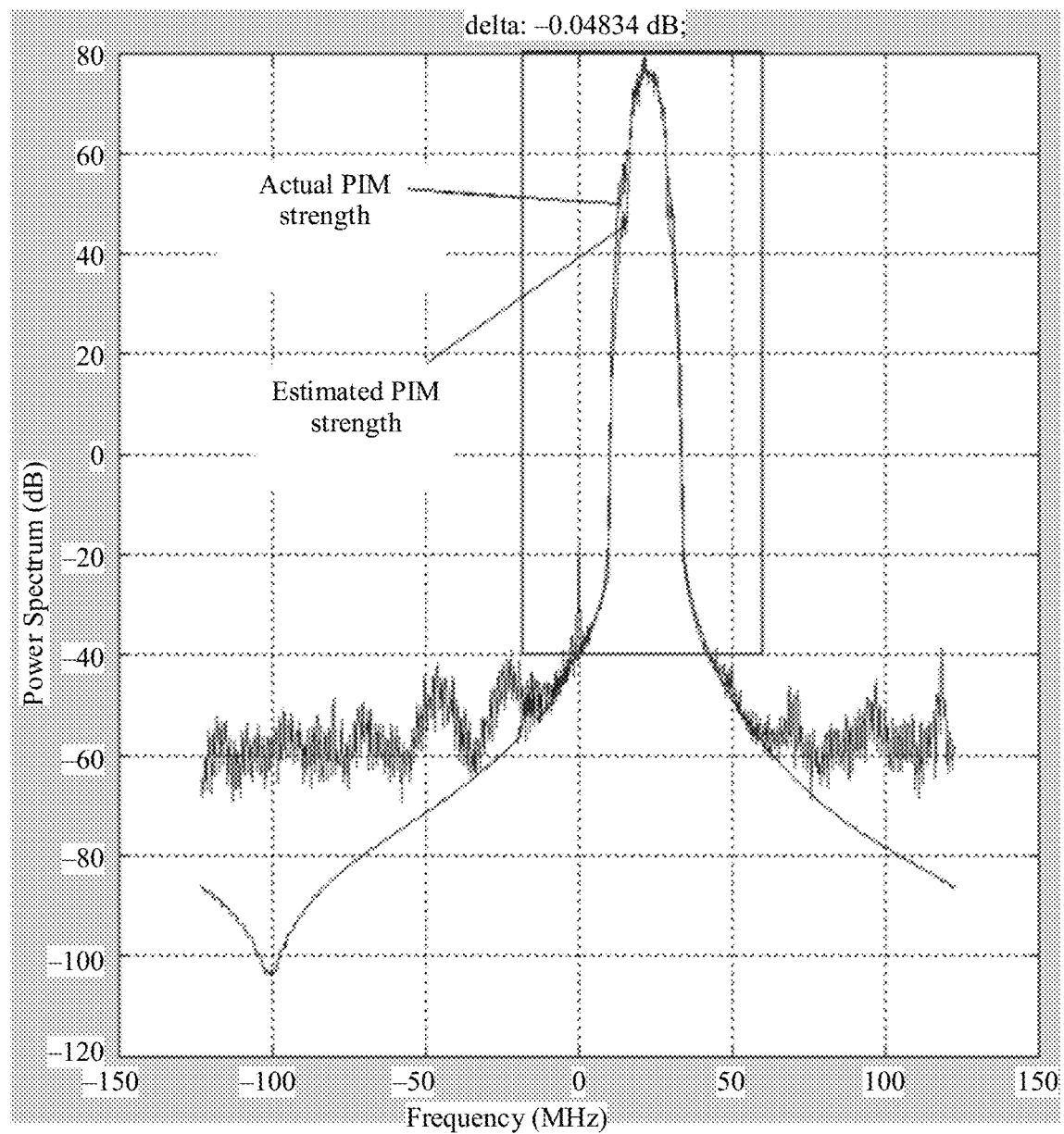
FIG. 2B is a schematic diagram of comparison between an estimated PIM strength value and an actual PIM strength value according to an embodiment of this application.

To reflect accuracy of the first PIM signal strength obtained in this embodiment of this application, an experiment is performed by using the method in this embodiment of this application. FIG. 2B is a schematic diagram of comparison between an estimated PIM strength value and an actual PIM strength value in this embodiment of this application. It can be learned from FIG. 2B that there is a high degree of overlapping between the estimated PIM strength value obtained by using the method in this embodiment of this application and the actual PIM strength value in the frame. This may indicate that the PIM strength value obtained by using the method in this embodiment of this application is accurate.

In the foregoing embodiment, the first PIM signal strength is determined based on the signal strength evaluation model, and there are a plurality of methods for obtaining the signal strength evaluation model. This is not limited in this embodiment of this application. The following describes one of the methods for obtaining the signal strength evaluation model.

Figure 3:
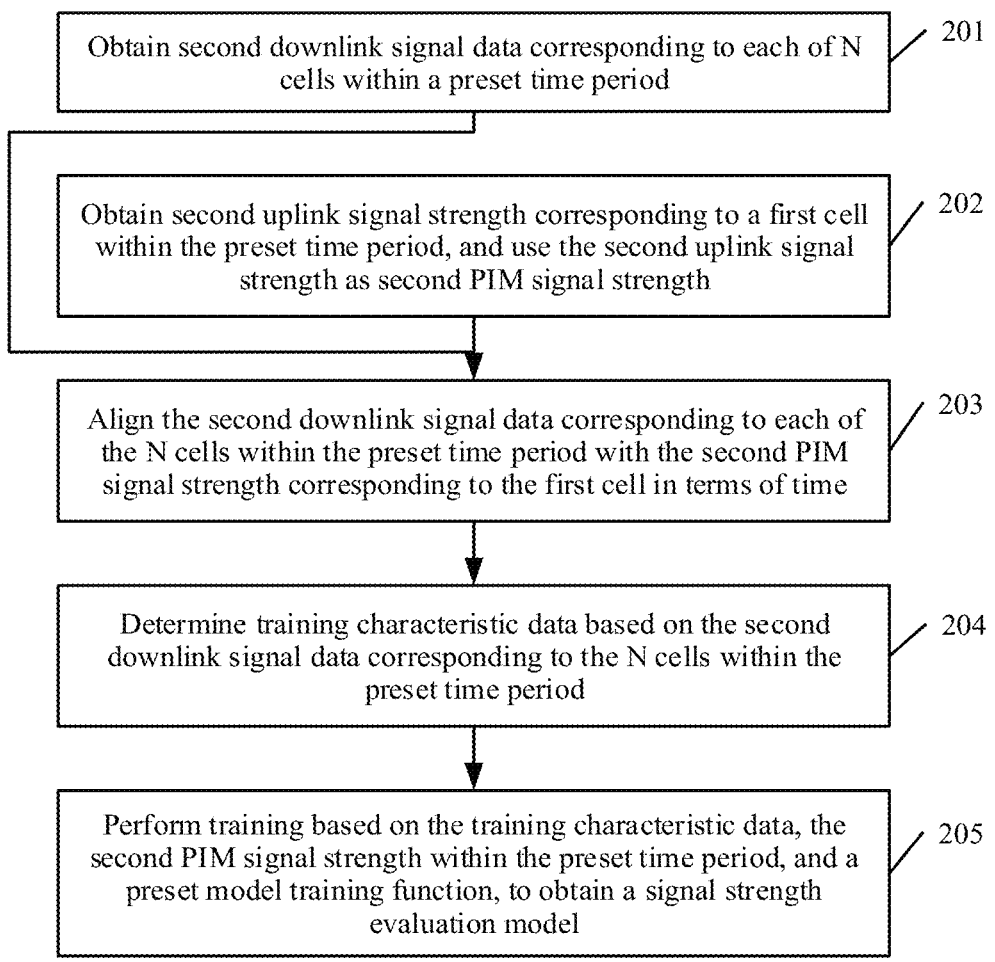
FIG. 3 is a schematic diagram of an embodiment of a method for acquiring a signal strength evaluation model according to an embodiment of this application.

FIG. 3 is a schematic diagram of an embodiment of a method for obtaining a signal strength evaluation model according to an embodiment of this application. This embodiment of this application provides a second embodiment of a signal processing method. In the second embodiment, the method further includes the following steps.

201: Obtain second downlink signal data corresponding to each of N cells within a preset time period, where none of the N cells has uplink data within the preset time period.

It may be understood that, a plurality of groups of training data need to be first collected for training, to obtain the signal strength evaluation model. In this embodiment of this application, the training data includes the second downlink signal data corresponding to each of the N cells within the preset time period, where each time point within the preset time period may be corresponding to one piece of downlink signal data, and the second downlink signal data may be downlink signal strength.

For example, the downlink signal strength at 8000 time points within two hours in an early morning may be collected as the second downlink signal data within the preset time period.

202: Obtain second uplink signal strength corresponding to a first cell within the preset time period, and use the second uplink signal strength as second PIM signal strength.

Because there is no uplink data in the N cells within the preset time period, a finally collected second uplink signal is a second PIM signal. It is similar to the second downlink signal data that, each time point within the preset time period is also corresponding to one piece of the second uplink signal strength.

In correspondence to the 8000 time points within two hours in the early morning in step 201, the second uplink signal strength at each time point is obtained as the second uplink signal strength.

203: Align the second downlink signal data corresponding to each of the N cells within the preset time period with the second PIM signal strength corresponding to the first cell in terms of time.

It may be understood that, assuming that a second downlink signal is sent to each of the N cells at a first moment, receiving time of the second PIM signal generated by the second downlink signal at the first moment should be later than that of the first moment. Therefore, in this embodiment of this application, the second downlink signal data is aligned with the second PIM signal strength, to determine a correspondence between each piece of the second downlink signal data and each piece of the second PIM signal strength within the preset time period.

Figure 4:
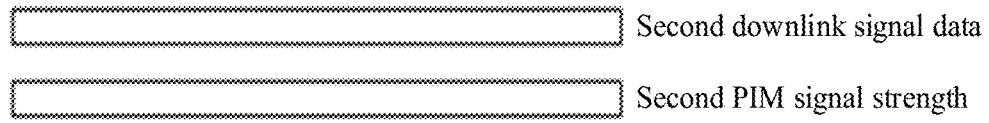
FIG. 4 is a schematic diagram of second downlink signal data and second PIM signal strength before alignment according to an embodiment of this application.
Figure 5:
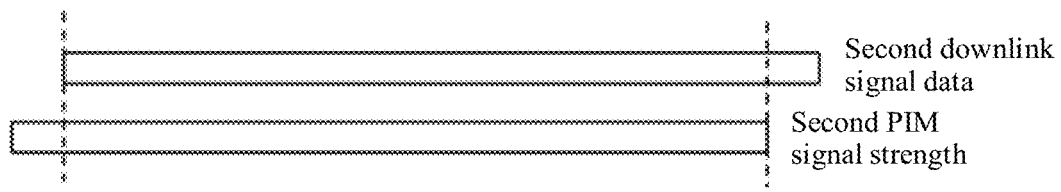
FIG. 5 is a schematic diagram of second downlink signal data and second PIM signal strength after alignment according to an embodiment of this application.

For a better understanding of aligning the second downlink signal data with the second PIM signal strength, refer to FIG. 4 and FIG. 5. FIG. 4 is a schematic diagram of second downlink signal data and second PIM signal strength before alignment according to an embodiment of this application. FIG. 5 is a schematic diagram of second downlink signal data and second PIM signal strength after alignment according to an embodiment of this application. In FIG. 5, the second downlink signal data and the second PIM signal strength are aligned between two dashed lines, in other words, data inside an area between the two dashed lines is valid data, and data outside the area between the two dashed lines is invalid data. It can be learned from comparison between FIG. 4 and FIG. 5 that, in this embodiment of this application, a correspondence between the second downlink signal data and the second PIM signal strength is determined through time alignment, and the invalid data is also removed.

204: Determine training characteristic data based on the second downlink signal data corresponding to the N cells within the preset time period.

It should be noted that a quantity and a type of the training characteristic data may be determined based on a model training function used for training and an actual requirement. This is not limited in this embodiment of this application.

205: Perform training based on the training characteristic data, the second PIM signal strength within the preset time period, and a preset model training function, to obtain the signal strength evaluation model.

Figure 6:
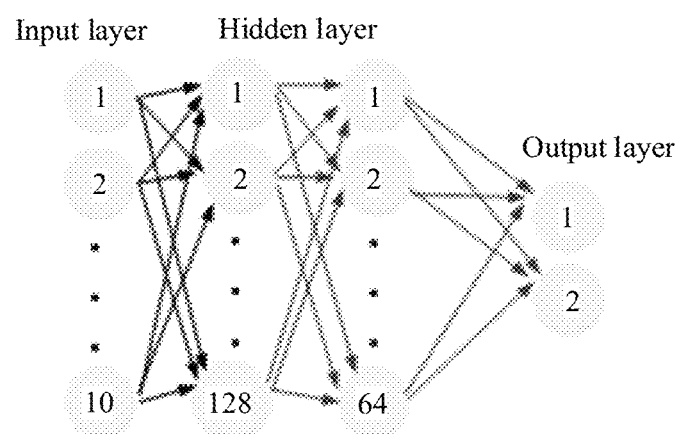
FIG. 6 is a schematic diagram of an MLP according to an embodiment of this application.

It should be noted that a plurality of model training functions are available for selection. For example, a multilayer perceptron MLP may be selected. To better understand a process of an MLP model, refer to FIG. 6, which is a schematic diagram of an MLP according to an embodiment of this application. As shown in FIG. 6, the MLP includes an input layer, a hidden layer, and an output layer. Numbers 1 to 10 in the input layer represent the training characteristic data determined in step 204. Based on the MLP shown in FIG. 6, a signal strength evaluation model required in this embodiment of this application can be obtained.

Based on the foregoing content, it can be learned that there are a plurality of methods for aligning the second downlink signal data with the second PIM signal strength in terms of time. The following describes the methods.

Figure 7:
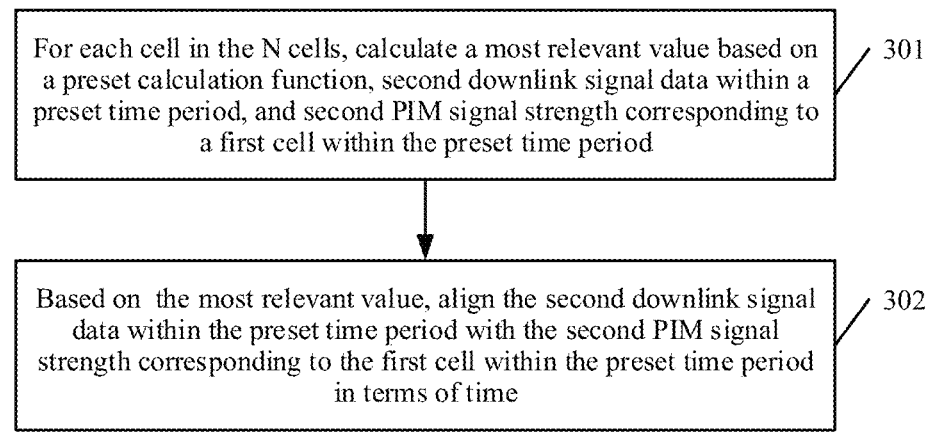
FIG. 7 is a schematic diagram of an embodiment in which signals are aligned in terms of time according to an embodiment of this application.

FIG. 7 is a schematic diagram of an embodiment in which signals are aligned in terms of time according to an embodiment of this application. This embodiment of this application provides a third embodiment of a signal processing method. In the third embodiment, aligning second downlink signal data corresponding to each of N cells within a preset time period with second PIM signal strength corresponding to a first cell within the preset time period includes the following steps.

301: For each cell in the N cells, calculate a most relevant value based on a preset calculation function, the second downlink signal data within the preset time period, and the second PIM signal strength corresponding to the first cell within the preset time period.

Figure 8:
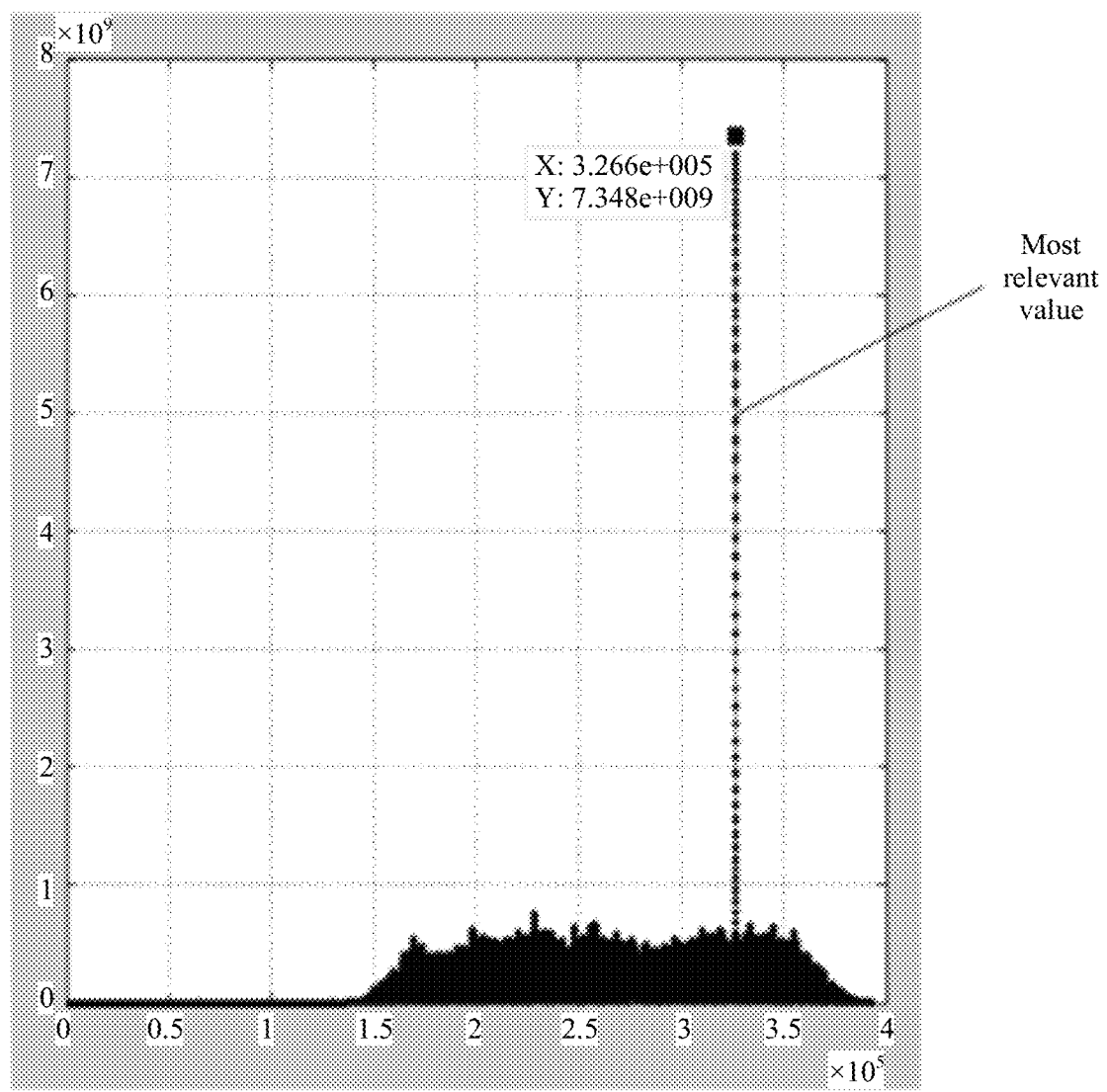
FIG. 8 is a schematic diagram of an embodiment of a most relevant value according to an embodiment of this application.

It should be noted that a plurality of calculation functions are available for selection. For example, an xcorr function may be selected as the calculation function. Because a process of calculating the most relevant value is a mature technology, details are not described herein again. FIG. 8 is a schematic diagram of an embodiment of a most relevant value according to an embodiment of this application. A location of the most relevant value is marked in FIG. 8.

302: Align, based on the most relevant value, the second downlink signal data within the preset time period with the second PIM signal strength corresponding to the first cell within the preset time period in terms of time.

It may be understood that, based on the location of the most relevant value in FIG. 8, the second downlink signal data may finally be aligned with the second PIM signal strength in terms of time. A specific alignment process is not described herein in detail.

It can be learned from the foregoing second embodiment that training characteristic data may include a plurality of types of data. The following describes the training characteristic data by using an example.

An embodiment of this application provides a fourth embodiment of a signal processing method. In the fourth embodiment, determining training characteristic data based on second downlink signal data corresponding to N cells within a preset time period includes:

generating M intermodulation bases based on the second downlink signal data corresponding to the N cells within the preset time period, where M is a positive integer.

The M intermodulation bases may include a third order intermodulation base, a fifth order intermodulation base, and the like. This is not limited in this embodiment of this application.

Then, the M intermodulation bases and the second downlink signal data corresponding to the N cells are determined as the training characteristic data.

The foregoing plurality of embodiments describe in detail a process of determining the first PIM signal strength, and the first PIM signal strength may be applied in many aspects. The following describes application of the first PIM signal strength.

An embodiment of this application provides a fifth embodiment of a method for determining training characteristic data. In this embodiment, the method further includes:

scheduling a bandwidth resource of a first cell based on first PIM signal strength of the first cell in a plurality of bandwidth resource scheduling solutions.

It can be learned from the foregoing analysis that, in correspondence to one bandwidth resource scheduling solution, in this embodiment of this application, PIM signal strength corresponding to each of the N cells can be obtained. When there are the plurality of bandwidth resource scheduling solutions, in this embodiment of this application, the PIM signal strength of the N cells corresponding to the plurality of scheduling solutions can be obtained. For ease of understanding, refer to the following table.

| | Bandwidth resource scheduling solution | | | | | Impact on PIM signals | |
|---|---|---|---|---|---|---|---|
| | NR 700 MHz cell with a bandwidth of 10 MHz | | LTE 800 MHz cell with a bandwidth of 10 MHz | | UMTS 900 MHz cell with a bandwidth of 5 MHz | LTE 800 MHz cell with a bandwidth of 10 MHz | UMTS 900 MHz cell with a bandwidth of 5 MHz |
| | Starting RBG No. | Ending RBG No. | Starting RBG No. | Ending RBG No. | | | |
| 1 | 1 | 17 | 1 | 16 | 43 dBm | [5, 9, 12 . . .] | [5, 9, 12 . . .] |
| 2 | 1 | 17 | 1 | 16 | 42 dBm | [2, 6, 9 . . .] | [2, 6, 9 . . .] |
| 3 | 1 | 17 | 1 | 16 | 41 dBm | [0, 3, 6 . . .] | [0, 3, 6 . . .] |
| 4 | 1 | 17 | 1 | 15 | 43 dBm | [0, 5, 9 . . .] | [0, 5, 9 . . .] |
| 5 | 1 | 17 | 1 | 15 | 42 dBm | [0, 2, 6 . . .] | [0, 2, 6 . . .] |
| 6 | 1 | 17 | 1 | 15 | 41 dBm | [0, 0, 3 . . .] | [0, 0, 3 . . .] |
| 7 | 1 | 17 | 1 | 14 | 43 dBm | [0, 0, 5 . . .] | [0, 0, 5 . . .] |

As shown in the preceding table, there are three cells: an NR 700 MHz cell, an LTE 800 MHz cell, and a UMTS 900 MHz cell. There are seven bandwidth resource scheduling solutions. In this embodiment of this application, bandwidth resources of the NR 700 MHz cell and the LTE 800 MHz cell are divided into a plurality of RBGs, where one RBG includes a plurality of RB resources, and the RBGs are respectively represented by numbers from 1 to 17. A first bandwidth resource scheduling solution is used as an example. For the NR 700 MHZ cell, 1 to 17 RBGs are used to transmit a downlink signal; for the LTE 800 MHZ cell, 1 to 16 RBGs are used to transmit a downlink signal; for the UMTS 900 MHz cell, 43 dBm is used to transmit a downlink signal. In correspondence to the first bandwidth resource scheduling solution, PIM signal strength corresponding to each cell is obtained. As shown in the foregoing table, in this embodiment of this application, the PIM signal strength is mapped to each RBG. For the LTE 800 MHZ cell, a PIM signal strength mapping result is [5,9,12 . . . ].

It can be learned that, in correspondence to each bandwidth scheduling solution, an impact of the PIM signal on each cell can be obtained, and the impact may be specific to each RBG. Therefore, the bandwidth resource of the first cell may be scheduled based on the first PIM signal strength of the first cell in a plurality of bandwidth resource scheduling solutions.

Performing scheduling based on the first PIM signal strength of the first cell in the plurality of bandwidth resource scheduling solutions includes: Avoidance in a frequency domain position may be performed, to be specific, one bandwidth resource scheduling solution is selected, so that a value of the first PIM signal strength is within an acceptable range. Avoidance in time domain may be performed, to be specific, for a frequency division duplex (FDD) system, when scheduling is performed at the same time according to the bandwidth resource scheduling solution, if a PIM signal exists, a policy of transmitting a downlink signal and receiving an uplink signal at different time may be used. Alternatively, an uplink power convergence measure may be performed, to be specific, for one bandwidth resource scheduling solution, if a PIM signal exists, to reduce impact of the PIM signal, power convergence may be performed on a plurality of valid uplink signals to obtain a high signal-to-noise ratio, so that, interference of the PIM signal can be reduced.

It may be understood that, in addition to the foregoing plurality of scheduling methods, another scheduling solution may be used for scheduling. This is not limited in this embodiment of this application.

The foregoing describes a process of performing scheduling based on the first PIM signal strength. In a sixth embodiment of a signal processing method provided in an embodiment of this application, the method further includes:
determining a quality of an antenna feeder system according to first PIM signal strength of a first cell.

It may be understood that the first PIM signal strength may be used as a parameter of the quality of the antenna feeder system.

Figure 9:
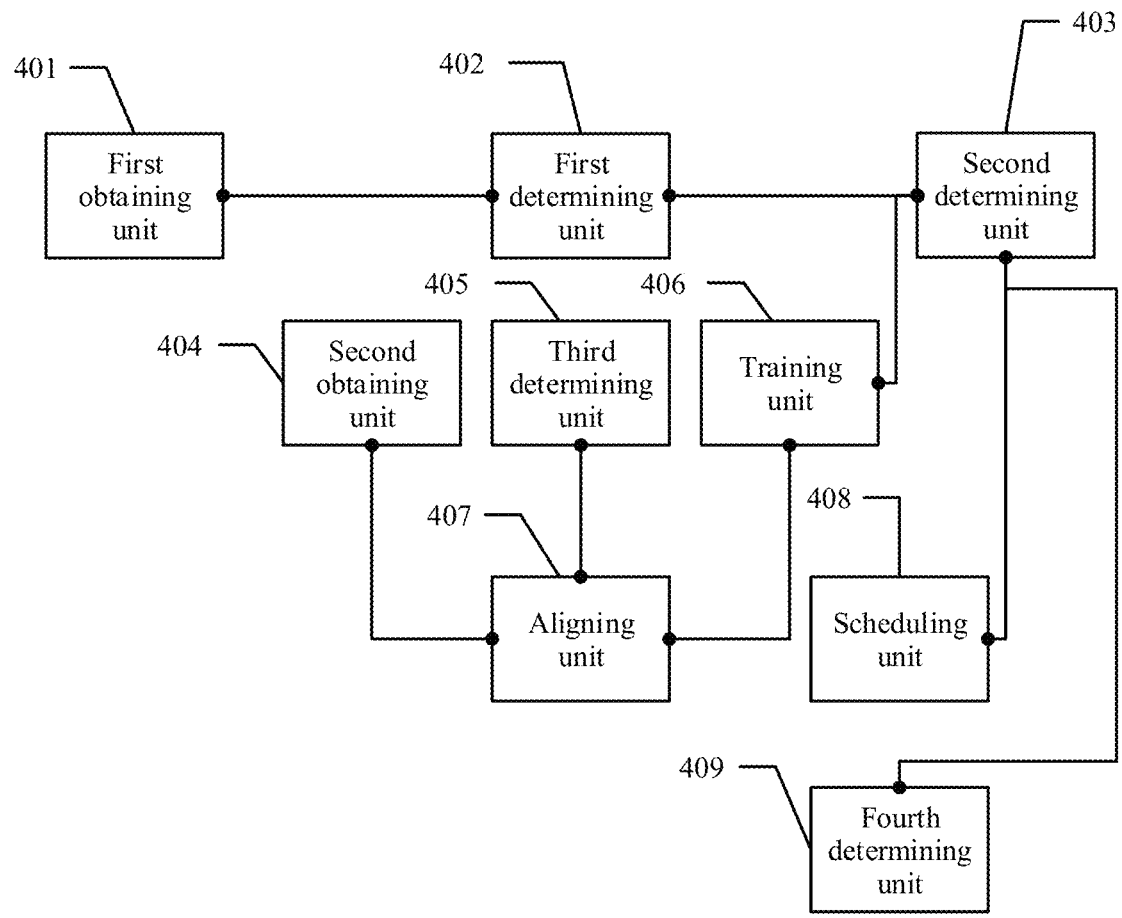
FIG. 9 is a schematic diagram of an embodiment of a signal processing apparatus according to an embodiment of this application.

FIG. 9 is a schematic diagram of an embodiment of a signal processing apparatus according to an embodiment of this application. As shown in FIG. 9, this embodiment of this application provides an embodiment of the signal processing apparatus, including:
a first obtaining unit 401, configured to obtain first downlink signal data corresponding to each of N cells in a preset bandwidth resource scheduling solution, where N is a positive integer greater than 1;
a first determining unit 402, configured to determine first characteristic data corresponding to each piece of the first downlink signal data; and
a second determining unit 403, configured to determine, based on a preset signal strength evaluation model and characteristic data corresponding to each of the N cells, first passive intermodulation PIM signal strength corresponding to a first cell, where the signal strength evaluation model is used to output the first PIM signal strength based on the input first characteristic data, and the first cell is any one of the N cells.

This embodiment of this application further provides another embodiment of the signal processing apparatus. In this embodiment, the signal processing apparatus further includes:
a second obtaining unit 404, configured to obtain second downlink signal data corresponding to each of the N cells within a preset time period, where none of the N cells has uplink data within the preset time period, where
the second obtaining unit 404 is further configured to obtain second uplink signal strength corresponding to a first cell within the preset time period, and use the second uplink signal strength as second PIM signal strength;
a third determining unit 405, configured to determine training characteristic data according to the second downlink signal data corresponding to the N cells within the preset time period; and
a training unit 406, configured to perform training based on the training characteristic data, the second PIM signal strength within the preset time period, and a preset model training function, to obtain a signal strength evaluation model.

This embodiment of this application further provides another embodiment of the signal processing apparatus. In this embodiment, the signal processing apparatus further includes:
an aligning unit 407, configured to align second downlink signal data corresponding to each of N cells within a preset time period with second PIM signal strength corresponding to a first cell in terms of time.

This embodiment of this application further provides another embodiment of the signal processing apparatus. In this embodiment, the alignment unit 407 is configured to:
for each cell in the N cells, calculate a most relevant value based on a preset calculation function, the second downlink signal data within the preset time period, and the second PIM signal strength corresponding to the first cell within the preset time period; and
based on the most relevant value, align the second downlink signal data within the preset time period with the second PIM signal strength corresponding to the first cell within the preset time period in terms of time.

This embodiment of this application further provides another embodiment of the signal processing apparatus. In this embodiment, the third determining unit 405 is configured to:
generate M intermodulation bases based on the second downlink signal data corresponding to the N cells within the preset time period, where M is a positive integer; and
determine the M intermodulation bases and the second downlink signal data corresponding to the N cells as the training characteristic data.

This embodiment of this application further provides another embodiment of the signal processing apparatus. In this embodiment, the signal processing apparatus further includes:

a scheduling unit 408, configured to schedule a bandwidth resource of a first cell based on first PIM signal strength of the first cell in a plurality of bandwidth resource scheduling solutions.

This embodiment of this application further provides another embodiment of the signal processing apparatus. In this embodiment, a fourth determining unit 409 is configured to determine a quality of an antenna feeder system according to first PIM signal strength of a first cell.

Figure 10:
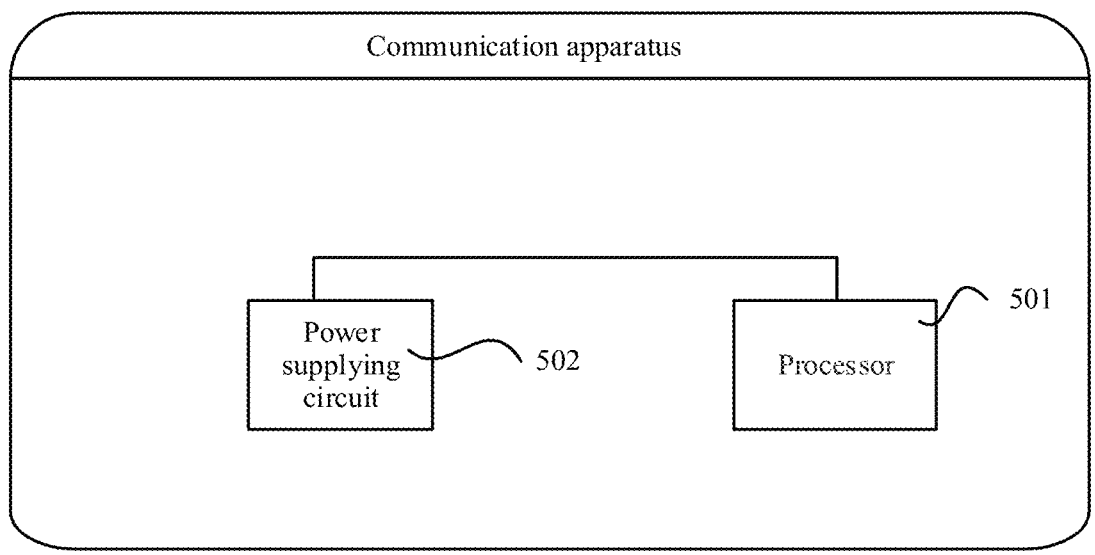
FIG. 10 is a schematic diagram of an embodiment of a communication apparatus according to an embodiment of this application.

FIG. 10 is a schematic diagram of an embodiment of a communication apparatus according to an embodiment of this application. This embodiment of this application further provides an embodiment of a communication apparatus, including at least one processor 501 and a power supplying circuit 502, where the power supplying circuit 502 is configured to supply power to the processor 501, and related program instructions are executed in the at least one processor 501, to enable the communication apparatus to implement the method according to any one of embodiments of this application.

In this embodiment, the processor 501 may perform the operations performed by the signal processing apparatus in the embodiment shown in FIG. 9. Details are not described herein again.

In this embodiment, specific functional module division of the processor 501 may be similar to the functional module division of the units described in FIG. 9. Details are not described herein again.

The power supplying circuit 502 in this embodiment of this application includes but is not limited to at least one of the following: a power supplying subsystem, a power management integrated circuit, a power consumption management processor, or a power consumption management control circuit.

An embodiment of this application provides a computer-readable storage medium, including instructions, and when the instructions are run on a computer, the computer is enabled to perform the method according to any one of embodiments of this application.

An embodiment of this application further provides a computer program product, where the computer program product includes computer software instructions, and the computer software instructions may be loaded by a processor to implement procedures in the signal processing methods in FIG. 2A, FIG. 3, and FIG. 7.

It may be clearly understood by a person skilled in the art that, for convenient and brief descriptions, for a detailed working process of the foregoing system, apparatus, and unit, refer to a corresponding process in the method embodiments. Details are not described herein again.

In the plurality of embodiments provided in this application, it should be understood that the disclosed system, apparatus, and method may be implemented in other manners. For example, the described apparatus embodiments are merely examples. For example, division of the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or the units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on actual requirements to achieve objectives of the solutions in the embodiments of this application.

In addition, each functional unit in embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of the software functional unit and is sold or used as an independent product, the integrated unit may be stored in a computer-readable storage medium. Based on such an understanding, the technical solutions of this application essentially, or the part contributing to a conventional technology, or all or some of the technical solutions may be implemented in the form of a software product. The computer software product is stored in a storage medium and includes plurality of instructions for instructing a computer device (which may be a personal computer, a server, or a network device, and the like) to perform all or some of the steps of the methods described in embodiments of this application. The storage medium includes any medium that can store program code, such as a USB flash drive, a removable hard disk, a read-only memory (ROM), a random access memory (RAM), a magnetic disk, or an optical disc.

What is claimed is:

1. A signal processing method, comprising:
   obtaining first downlink signal data corresponding to each of N cells in a preset bandwidth resource scheduling solution, wherein N is a positive integer greater than 1;
   determining first characteristic data corresponding to each piece of the first downlink signal data; and
   determining, based on a preset signal strength evaluation model and the first characteristic data corresponding to each of the N cells, a first passive intermodulation (PIM) signal strength corresponding to a first cell, wherein the signal strength evaluation model is used to output the first PIM signal strength based on input the first characteristic data, and the first cell is one of the N cells;
   wherein before the determining, based on the preset signal strength evaluation model and the first characteristic data corresponding to each of the N cells, the first PIM signal strength corresponding to the first cell, the method further comprises:
   obtaining second downlink signal data corresponding to each of the N cells within a preset time period, wherein none of the N cells has uplink data being received within the preset time period;
   obtaining a second uplink signal strength corresponding to the first cell within the preset time period, and using the second uplink signal strength as a second PIM signal strength;
   determining training characteristic data based on the second downlink signal data corresponding to the N cells within the preset time period; and
   performing training, based on: the training characteristic data; the second PIM signal strength within the preset time period; and a preset model training function, to obtain the signal strength evaluation model.

2. The method according to claim 1, wherein before the determining training characteristic data based on the second downlink signal data corresponding to the N cells within the preset time period, the method further comprises:
aligning the second downlink signal data corresponding to each of the N cells within the preset time period with the second PIM signal strength corresponding to the first cell in terms of time.

3. The method according to claim 2, wherein the aligning the second downlink signal data corresponding to each of the N cells within the preset time period with the second PIM signal strength corresponding to the first cell in terms of time comprises:
for each cell in the N cells, calculating a most relevant value based on a preset calculation function, the second downlink signal data within the preset time period, and the second PIM signal strength corresponding to the first cell within the preset time period; and
aligning, based on the most relevant value, the second downlink signal data within the preset time period with the second PIM signal strength corresponding to the first cell within the preset time period in terms of time.

4. The method according to claim 1, wherein the determining training characteristic data based on the second downlink signal data corresponding to the N cells within the preset time period comprises:
generating M intermodulation bases based on the second downlink signal data corresponding to the N cells within the preset time period, wherein M is a positive integer; and
determining the M intermodulation bases and the second downlink signal data corresponding to the N cells as the training characteristic data.

5. The method according to claim 1, wherein the method further comprises:
scheduling a bandwidth resource of the first cell based on the first PIM signal strength of the first cell in a plurality of bandwidth resource scheduling solutions.

6. The method according to claim 1, wherein the method further comprises:
determining a health degree of an antenna feeder system according to the first PIM signal strength of the first cell.

7. A signal processing apparatus, comprising:
a processor; and
a memory coupled to the processor, wherein the memory comprises instructions that, when executed by the processor, causes the apparatus to perform operations comprising:
obtaining first downlink signal data corresponding to each of N cells in a preset bandwidth resource scheduling solution, wherein N is a positive integer greater than 1;
determining first characteristic data corresponding to each piece of the first downlink signal data; and
determining, based on a preset signal strength evaluation model and the first characteristic data corresponding to each of the N cells, a first passive intermodulation (PIM) signal strength corresponding to a first cell, wherein the signal strength evaluation model is used to output the first PIM signal strength based on input the first characteristic data, and the first cell is one of the N cells;

wherein the operations further comprise:
before the determining, based on the preset signal strength evaluation model and the first characteristic data corresponding to each of the N cells, the first PIM signal strength corresponding to the first cell;
obtaining second downlink signal data corresponding to each of the N cells within a preset time period, wherein none of the N cells has uplink data being received within the preset time period;
obtaining a second uplink signal strength corresponding to the first cell within the preset time period, and using the second uplink signal strength as a second PIM signal strength;
determining training characteristic data based on the second downlink signal data corresponding to the N cells within the preset time period; and
performing training based on; the training characteristic data; the second PIM signal strength within the preset time period; and a preset model training function, to obtain the signal strength evaluation model.

8. The signal processing apparatus according to claim 7, wherein the operations further comprise:
aligning the second downlink signal data corresponding to each of the N cells within the preset time period with the second PIM signal strength corresponding to the first cell in terms of time.

9. The signal processing apparatus according to claim 8, wherein the operations further comprise:
for each cell in the N cells, calculating a most relevant value based on a preset calculation function, the second downlink signal data within the preset time period, and the second PIM signal strength corresponding to the first cell within the preset time period; and
aligning, based on the most relevant value, the second downlink signal data within the preset time period with the second PIM signal strength corresponding to the first cell within the preset time period in terms of time.

10. The signal processing apparatus according to claim 7, wherein the operations further comprise:
generating M intermodulation bases based on the second downlink signal data corresponding to the N cells within the preset time period, wherein M is a positive integer; and
determining the M intermodulation bases and the second downlink signal data corresponding to the N cells as the training characteristic data.

11. The signal processing apparatus according to claim 7, wherein the operations further comprise:
scheduling a bandwidth resource of the first cell based on the first PIM signal strength of the first cell in a plurality of bandwidth resource scheduling solutions.

12. The signal processing apparatus according to claim 7, wherein the operations further comprise:
determining a health degree of an antenna feeder system according to the first PIM signal strength of the first cell.

* * * * *

UNITED STATES PATENT AND TRADEMARK OFFICE
CERTIFICATE OF CORRECTION

| | | |
|---|---|---|
| PATENT NO. | : 12,113,586 B2 | Page 1 of 1 |
| APPLICATION NO. | : 17/732051 | |
| DATED | : October 8, 2024 | |
| INVENTOR(S) | : Zha et al. | |

It is certified that error appears in the above-identified patent and that said Letters Patent is hereby corrected as shown below:

In the Claims

Claim 7: Column 16, Line 8: "PIM signal strength corresponding to the first cell;" should read as -- PIM signal strength corresponding to the first cell: --.

Claim 7: Column 16, Line 20: "performing training based on; the training characteris-" should read as -- performing training based on: the training characteris- --.

Signed and Sealed this
Twentieth Day of May, 2025

Coke Morgan Stewart
*Acting Director of the United States Patent and Trademark Office*